United States Patent
Huang et al.

(10) Patent No.: US 8,823,099 B2
(45) Date of Patent: Sep. 2, 2014

(54) SEMICONDUCTOR DEVICE HAVING GRADIENT DOPING PROFILE

(71) Applicant: Taiwan Semiconductor Manufacturing Company, Ltd., Hsin-Chu (TW)

(72) Inventors: Chih-Hsiang Huang, Zhubei (TW); Feng-Cheng Yang, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/959,972

(22) Filed: Aug. 6, 2013

(65) Prior Publication Data

US 2013/0313642 A1    Nov. 28, 2013

Related U.S. Application Data

(62) Division of application No. 13/157,930, filed on Jun. 10, 2011, now Pat. No. 8,501,569.

(51) Int. Cl.
*H01L 21/02* (2006.01)
(52) U.S. Cl.
USPC .................................. 257/344; 257/E21.431
(58) Field of Classification Search
USPC .......................................... 257/344, 346, 408
See application file for complete search history.

(56) References Cited

U.S. PATENT DOCUMENTS

| 5,168,072 | A | * | 12/1992 | Moslehi ........................ 438/300 |
| 5,747,373 | A | * | 5/1998 | Yu .................................. 438/305 |
| 6,235,600 | B1 | | 5/2001 | Chiang et al. |
| 6,258,680 | B1 | * | 7/2001 | Fulford et al. ................ 438/305 |
| 7,687,364 | B2 | | 3/2010 | Sell |
| 2006/0068556 | A1 | * | 3/2006 | Noda ............................ 438/305 |
| 2007/0269951 | A1 | | 11/2007 | Lu et al. |
| 2008/0299735 | A1 | | 12/2008 | Nouri et al. |
| 2011/0034013 | A1 | | 2/2011 | Hatem et al. |
| 2011/0183486 | A1 | | 7/2011 | Chan et al. |

* cited by examiner

*Primary Examiner* — Reema Patel
(74) *Attorney, Agent, or Firm* — Haynes and Boone, LLP

(57) ABSTRACT

The present disclosure provides a method of fabricating a semiconductor device. The method includes forming a gate over a substrate. The method includes performing a first implantation process to form a first doped region in the substrate, the first doped region being adjacent to the gate. The method includes performing a second implantation process to form a second doped region in the substrate, the second doped region being formed farther away from the gate than the first doped region, the second doped region having a higher doping concentration level than the first doped region. The method includes removing portions of the first and second doped regions to form a recess in the substrate. The method includes epitaxially growing a third doped region in the recess, the third doped region having a higher doping concentration level than the second doped region.

19 Claims, 11 Drawing Sheets

SEMICONDUCTOR DEVICE HAVING GRADIENT DOPING PROFILE

PRIORITY DATA

This application is a divisional application of U.S. patent application Ser. No. 13/157,930, filed on Jun. 10, 2011, entitled "Semiconductor Device Having Gradient Doping Profile", which is issued as U.S. Pat. No. 8,501,569 on Aug. 6, 2013, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs may contain transistor devices that have doped regions. As transistor sizes continue to shrink, it is more difficult to prevent undesirable out-diffusion of the doped regions. Such out-diffusion may interfere with transistor device operation and/or degrade transistor performance. In addition, the shrinking transistor sizes may lead to problems such as current crowding, high source/drain resistance, and non-optimal doping profile.

Therefore, while existing methods of fabricating semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
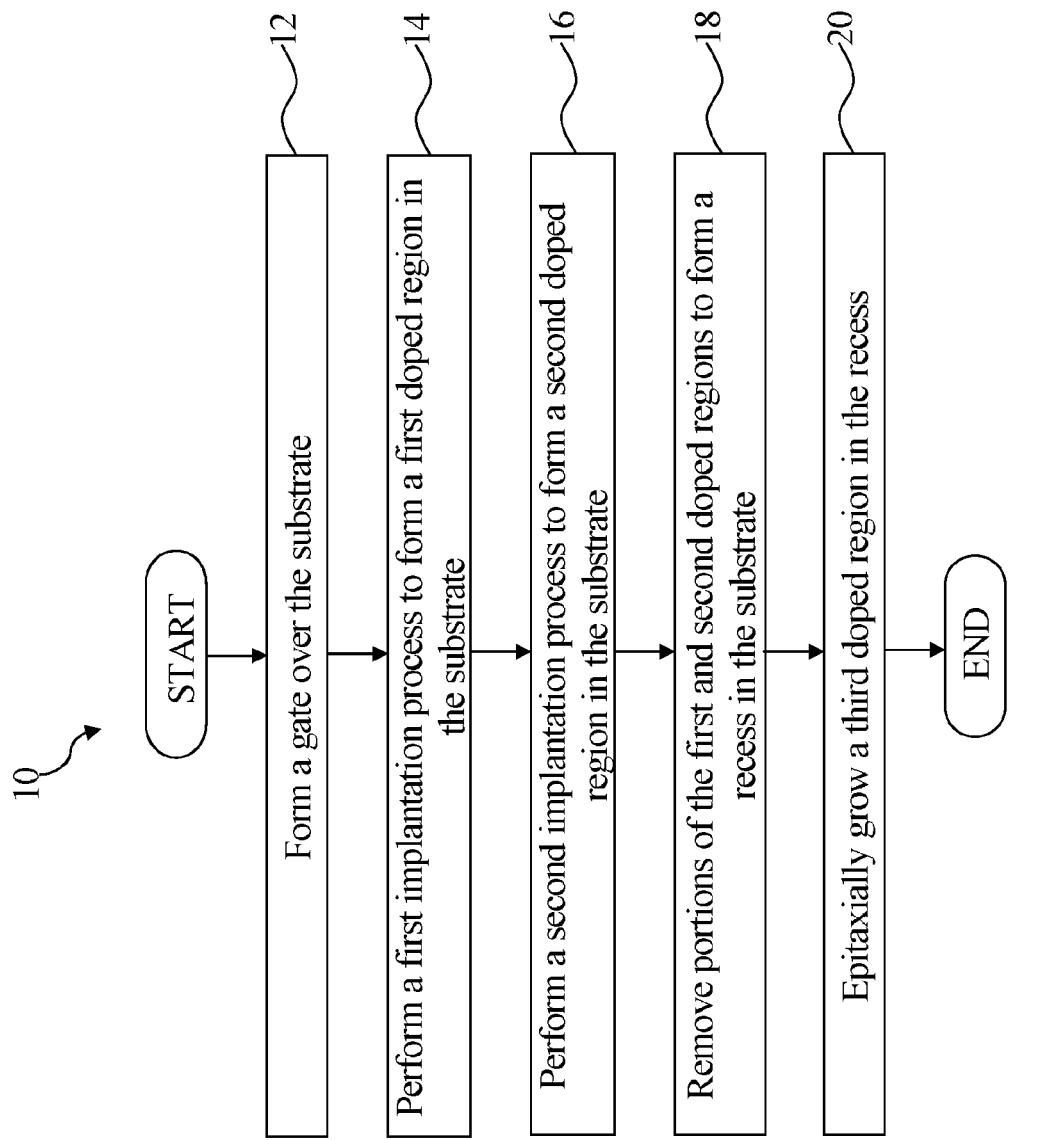
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 10 for fabricating a semiconductor device. FIGS. 2-11 are diagrammatic fragmentary cross-sectional side views, of the semiconductor device during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-11 have been simplified for a better understanding of the inventive concepts of the present disclosure. Accordingly, it should be noted that additional processes may be provided before, during, and after the method 10 of FIG. 1, and that some other processes may only be briefly described herein.

Referring to FIG. 1, the method 10 begins with block 12 in which a gate is formed over a substrate. The method 10 continues with block 14 in which a first implantation process is performed to form a first doped region in the substrate. The first doped region is adjacent to the gate. The method 10 continues with block 16 in which a second implantation process is performed to form a second doped region in the substrate. The second doped region is formed farther away from the gate than the first doped region. The second doped region has a higher doping concentration level than the first doped region. The method 10 continues with block 18 in which portions of the first and second doped regions are removed to form a recess in the substrate. The method 10 continues with block 20 in which a third doped region is epitaxially grown in the recess. The third doped region has a higher doping concentration level than the second doped region.

Figure 2:
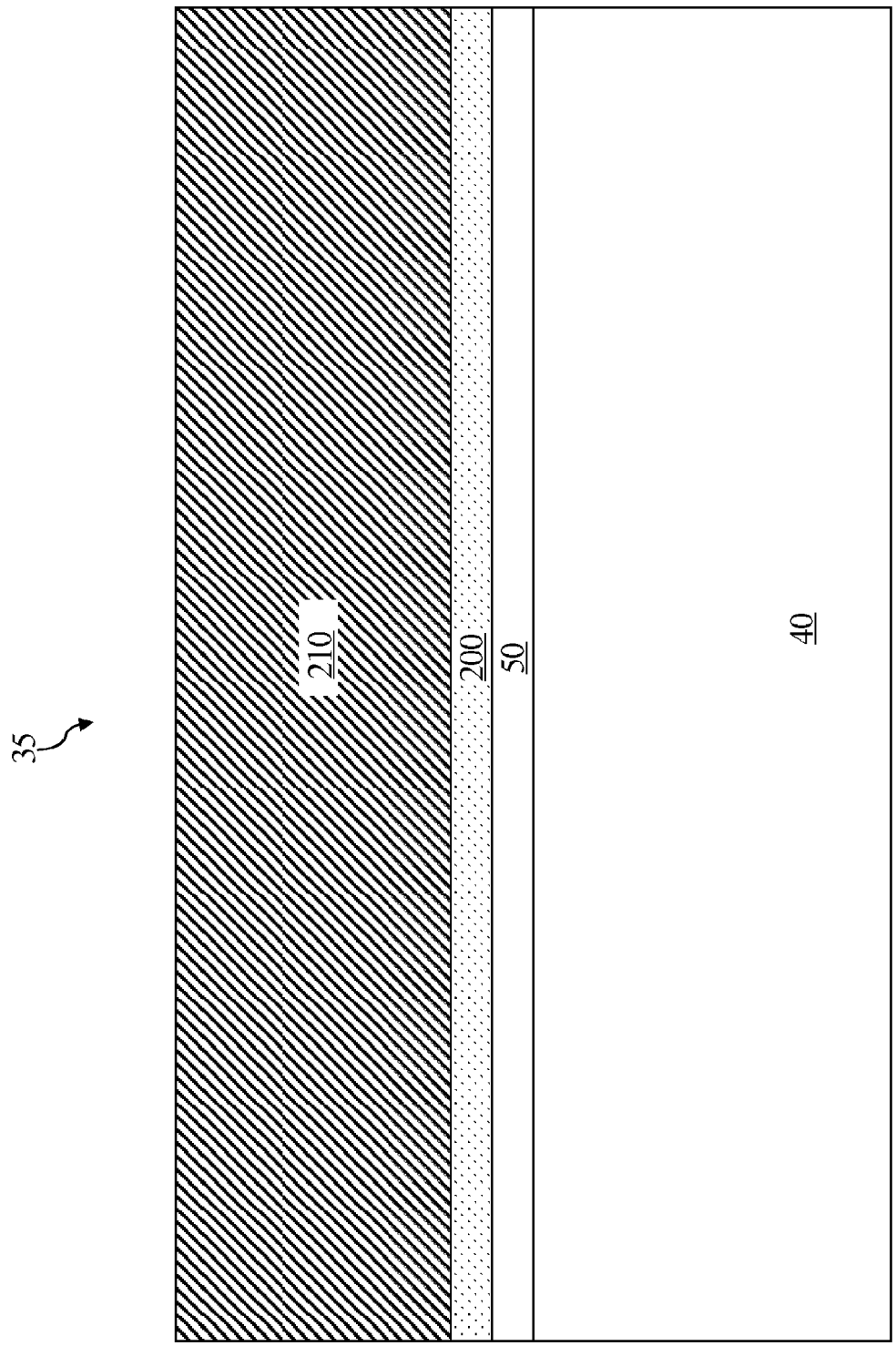
FIGS. 2 to 11 illustrate cross-sectional views of the semiconductor device at various stages of fabrication according to the method of FIG. 1.

Referring to FIG. 2, a semiconductor device 35 is fabricated in accordance with the method 10 of FIG. 1. The semiconductor device 35 has a substrate 40. The substrate 40 is a silicon substrate doped with a P-type dopant such as boron. The substrate 40 may alternatively be an N-type substrate or be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Isolation structures such as shallow trench isolation (STI) devices may be formed in the substrate 40. The STI devices are formed by etching recesses (or trenches) in the substrate 40 and filling the recesses with a dielectric material, such as silicon oxide, silicon nitride, silicon oxy-nitride, fluoride-doped silicate (FSG), and/or a low-k dielectric material known in the art. For the sake of simplicity, these isolation structures are not illustrated herein.

Thereafter, an interfacial layer 50 is optionally formed over the substrate 40. The interfacial layer 50 is formed by an atomic layer deposition (ALD) process and includes silicon oxide ($SiO_2$).

A gate dielectric layer 200 is then formed over the interfacial layer 50. The gate dielectric layer 200 is formed by an ALD process. In an embodiment, the gate dielectric layer 200 includes a high-k dielectric material. A high-k dielectric material is a material having a dielectric constant that is greater than a dielectric constant of $SiO_2$, which is approximately 4. In an embodiment, the gate dielectric layer 200 includes hafnium oxide ($HfO_2$), which has a dielectric constant that is in a range from approximately 18 to approximately 40. In alternative embodiments, the gate dielectric layer 200 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. A gate electrode layer 210 is then formed over the gate dielectric layer 200. The gate electrode layer 210 includes a polysilicon material in the embodiment shown.

Figure 3:
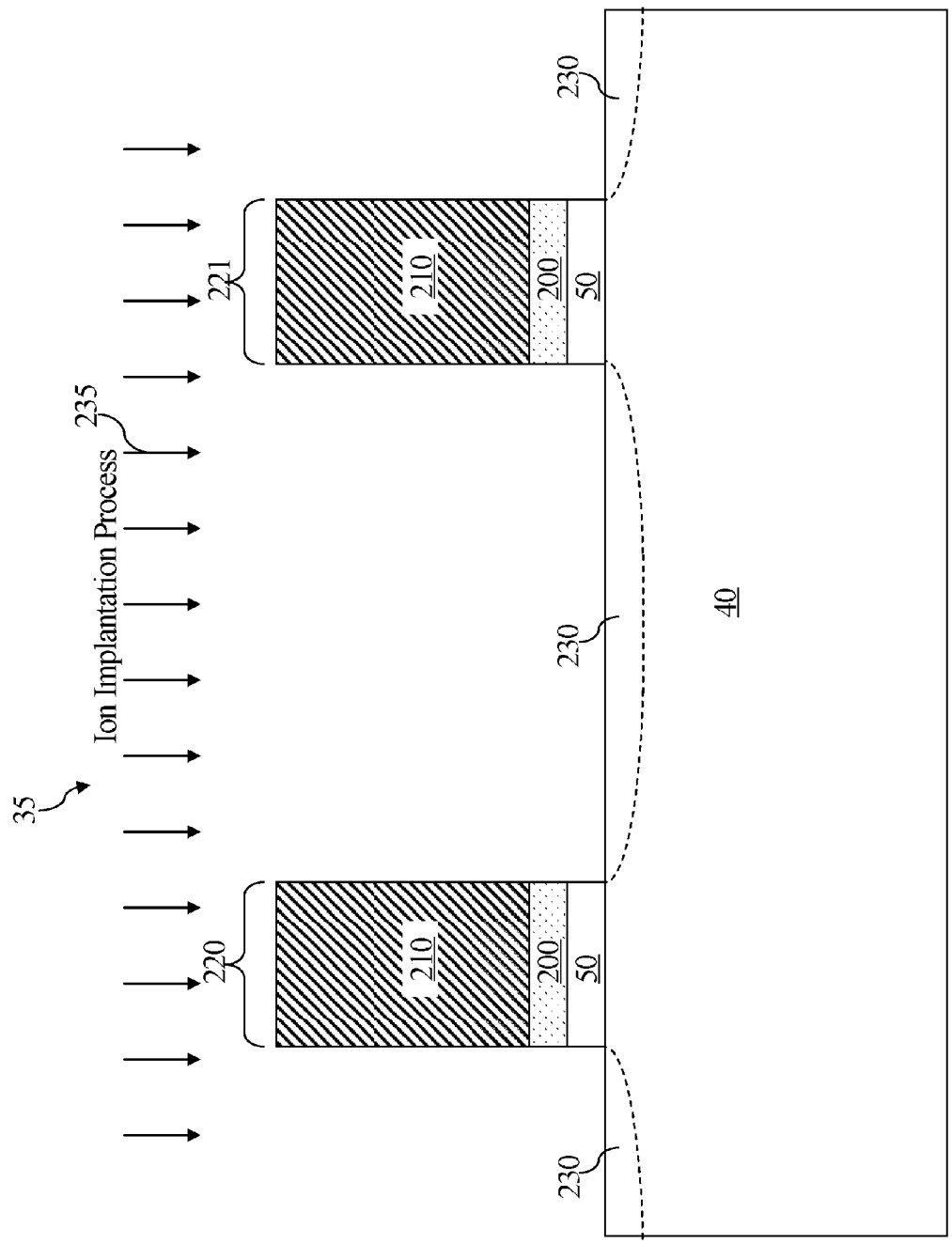

Referring to FIG. 3, the interfacial layer 50, the gate dielectric layer 200, and the gate electrode layer 210 are patterned using a photolithography process known in the art to form a plurality of gate structures (also referred to as gate stacks), two of which are shown herein as 220-221. Thereafter, lightly doped source/drain (also referred to as LDD) regions 230 are formed in portions of the substrate 40 on opposite sides of each of the gate structures 220-221. The LDD regions 230 may be formed by performing an ion implantation process 235 known in the art. The semiconductor device 35 here is an NMOS device, therefore N-type dopants such as phosphorus or arsenic with energy ranging from 1K~3K and dose from 5E14~2E15/centimeter$^2$ may be used to form the LDD regions 230. For other PMOS devices (not illustrated), P-type dopants such as boron may be used to form their respective LDD regions. Thereafter, a rapid thermal annealing (RTA) process is performed to anneal the LDD regions 230. The LDD regions 230 after the RTA process is performed may have a doping activation level that is in a range from about $5 \times 10^{19}$ atoms/centimeter$^3$ to about $2 \times 10^{20}$ atoms/centimeter$^3$.

Figure 4:
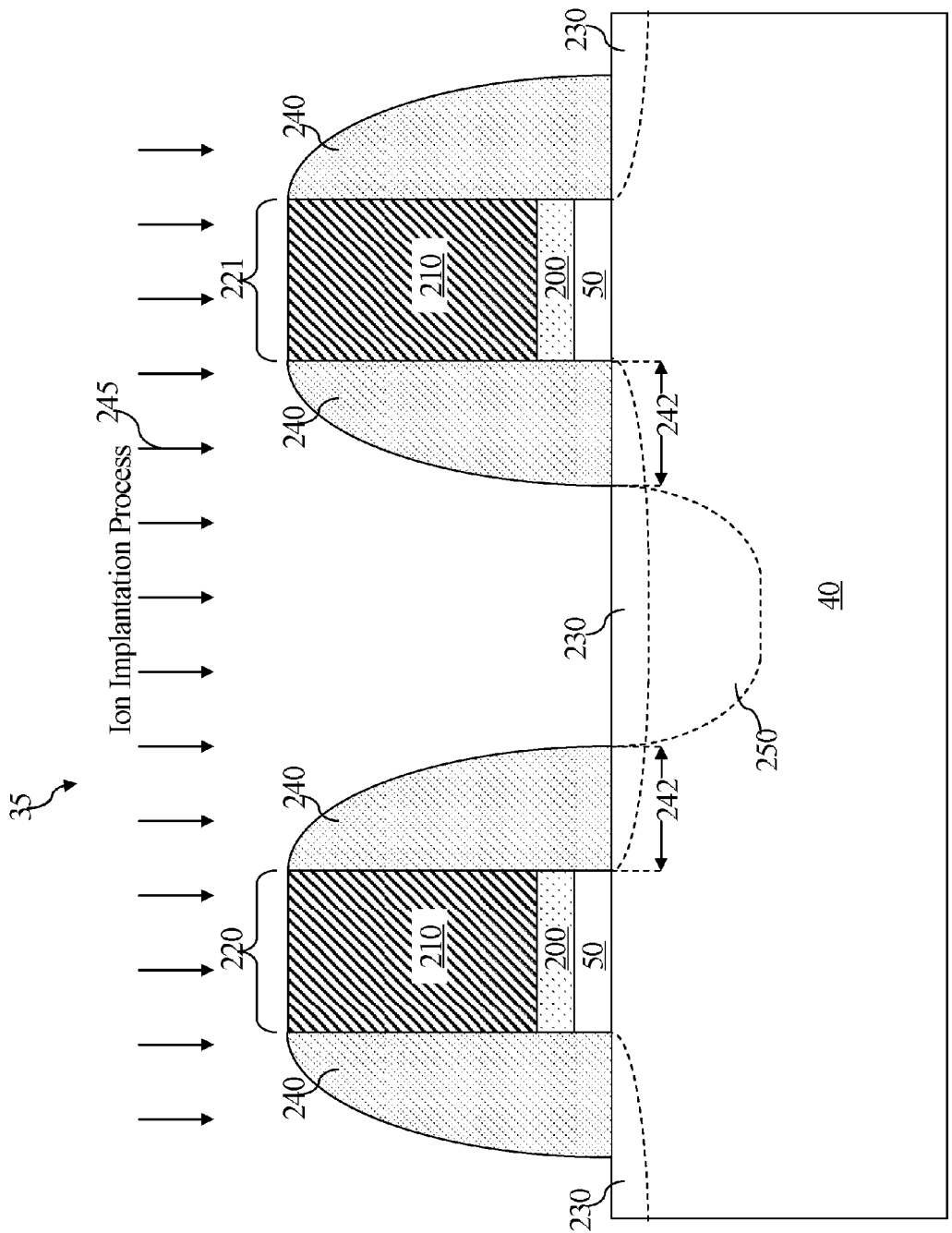

Referring now to FIG. 4, a plurality of gate spacers 240 are formed over the substrate 40 and on sidewalls of the gate structures 220-221 using a deposition process and an etching process (for example, an anisotropic etching process) known in the art. The gate spacers 240 include a suitable dielectric material such as silicon nitride, silicon oxide, silicon carbide, silicon oxy-nitride, or combinations thereof. The gate spacers 240 each have a lateral dimension (or width) 242. In an embodiment, the lateral dimension is in a range from about 12 nanometers (nm) to about 16 nm, for example about 14 nm.

Thereafter, an ion implantation process (not illustrated) is performed to form heavily doped P-type source/drain regions (also referred to as doped regions) for PMOS devices (not illustrated). For the NMOS semiconductor 35 illustrated in FIG. 4, a low temperature ion implantation process 245 is performed to form heavily doped N-type doped regions in portions of the substrate 40 not covered by the gates 220-221 and the spacers 240. As an example, one of such doped regions is illustrated herein as a doped region 250 between the gate structures 220 and 221.

The ion implantation process 245 is performed at a process temperature substantially lower than the process temperature for the ion implantation process 235, which may be performed at or above room temperature. In an embodiment, the process temperature for the ion implantation process 245 is in a range from about −60 degrees Celsius to about −100 degrees Celsius. The low temperatures used herein prevent undesirable ion out-diffusion in the substrate. For example, it prevents ion out-diffusion in the LDD regions 230 and/or out-diffusion in the doped region 250 as the doped region 250 is being formed. In an embodiment, the ion implantation process 245 uses phosphorous as a dopant. The ion implantation process 245 uses an implantation energy that is in a range from about 1 kilo-electron-volts (KeV) to about 3 KeV, for example about 2 KeV. The ion implantation process 245 also uses an implantation dose in a range between about $5 \times 10^{14}$ atoms/centimeter$^2$ to about $3 \times 10^{15}$ atoms/centimeter$^2$.

As is illustrated in FIG. 4, since the gate structures 220-221 and the spacers 240 prevent substrate regions therebelow from being implanted, the doped region 250 is approximately aligned with the outer boundaries of the gate spacers 240. Since no extra photolithography process is required to define the area or the boundaries of the doped region 250, it may be said that the doped region 250 is formed in a "self-aligning" manner. Stated differently, the spacers 240 help define the boundaries of the doped region 250. The doped region 250 partially overlaps with the LDD region 230 between the gate structures 220-221, though the doped region 250 extends further (or deeper) into the substrate 40 than the LDD region 230.

Figure 5:
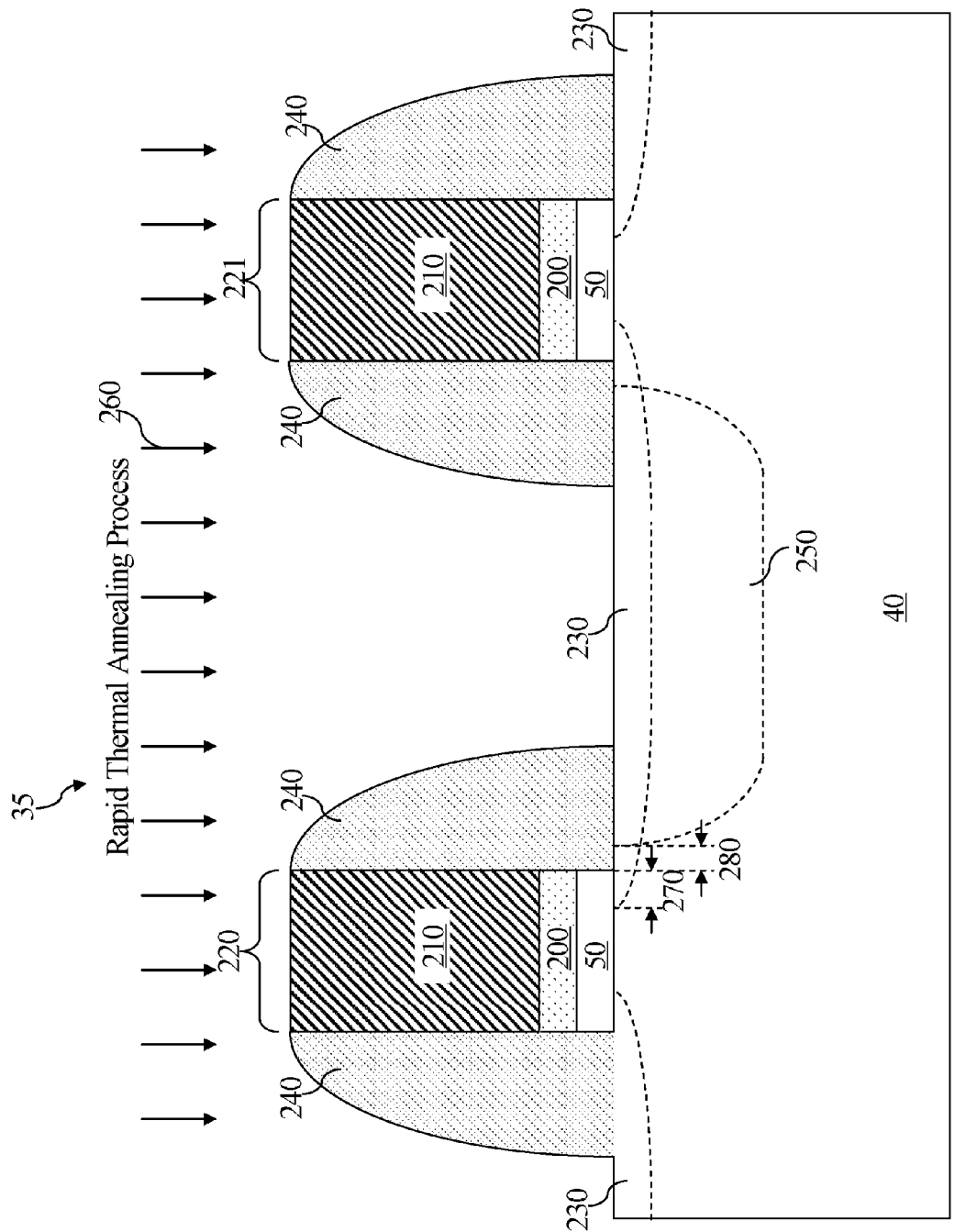

Referring now to FIG. 5, a rapid thermal annealing (RTA) process 260 is performed to activate the implanted dopant ions in the doped region 250. The RTA process 260 is performed at a process temperature in a range between about 990 degrees Celsius and about 1010 degrees Celsius with a duration that lasts for about 10 milli-seconds to about 100 milli-seconds. As a result of the RTA process 260, the LDD region 230 may experience some level of diffusion and may expand laterally into regions of the substrate below the gate structures 220-221, and the doped region 250 may also expand laterally into regions of the substrate below the spacers 240.

The amount of expansion of the LDD region 230 below the gate structure is measured by a distance 270, where the distance 270 is measured approximately from the tip of the LDD region 230 to the nearest sidewall of the gate structure. In an embodiment, the distance 270 is in a range from about 2 nm to about 5 nm, for example about 3 nm. Meanwhile, the doped region has expanded so that it has a tip that is spaced apart from the nearest sidewall of the gate structure by a distance 280. In an embodiment, the distance is in a range from about 0.5 nm to about 3 nm, for example about 2 nm.

Before the RTA process 260 is performed, the doping concentration level near a junction or border between the LDD region 230 and the doped region 250 may have a "step-function-like" profile. In other words, the doping concentration level in the LDD region 230 may be sharply lower than the doping concentration level in the doped region 250, such that it may have a sharp jump across the junction. After the RTA process 260 is performed, the implanted dopant ions in the doped region 250 (and in the LDD region 230) may expand due to diffusion as discussed above. Therefore, the "step-function-like" doping profile no long exists between junctions or boundaries between the LDD region 230 and the doped region 250. Instead, the junctions or boundaries between the LDD region 230 and the doped region 250 are not clearly defined and but more "blurred" or gradient. Hence, the doping profile may change more smoothly, rather than suddenly, from the LDD region 230 to the doped region 250. After the RTA process 260 is performed, the doped region has a doping concentration level that is in a range from about $2 \times 10^{20}$ atoms/centimeter$^3$ to about $4 \times 10^{20}$ atoms/centimeter$^3$.

Figure 6:
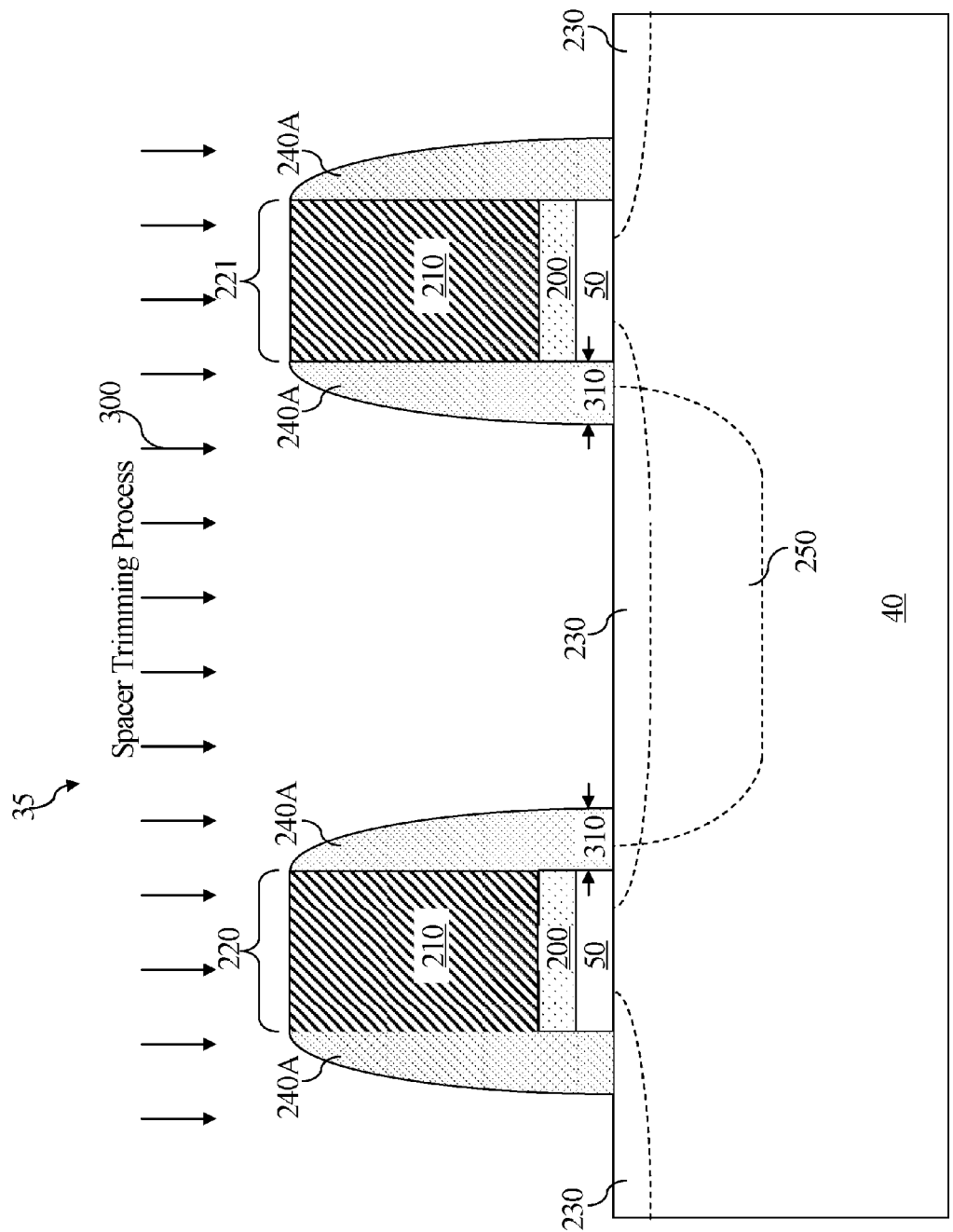

Referring now to FIG. 6, a spacer trimming process 300 is performed to trim the spacers 240. As a result, the trimmed spacers 240A each have a reduced lateral dimension or width 310. In an embodiment, the lateral dimension 310 is in a range from about 5 nm to about 9 nm, for example about 7 nm.

Figure 7:
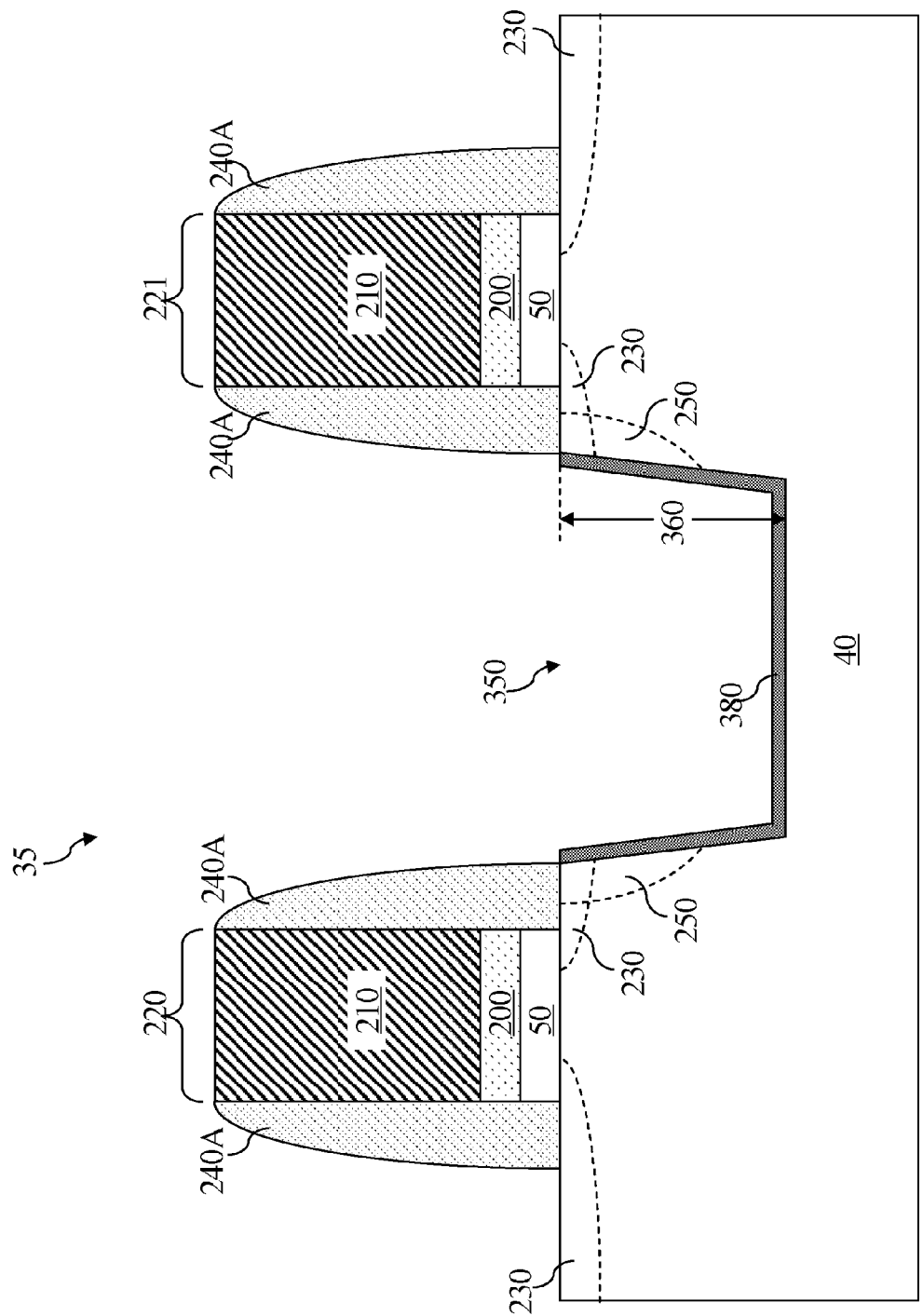

Referring to FIG. 7, a recess 350 is formed in a portion of the substrate 40 containing the LDD region 230 and the doped region 250. In an embodiment, the recess 350 is formed by a dry etching process. The recess 350 is approximately aligned with the outer boundaries of the spacers 240A. The recess 350 has a depth (or vertical dimension) 360. In an embodiment, the depth is in a range from about 200 Angstroms to about 300 Angstroms. Also, a layer 380 may be optionally formed on the exposed surfaces of the recess 350. The layer 380 includes a silicon material that is substantially free of phosphorous. In other words, the layer 380 is phosphorous-undoped. In some embodiments, the layer 380 may contain other types of impurities to enhance its conductivity. The layer 380 is thin, and it may have a thickness in a range from about 1 nm to about 5 nm.

Figure 8:
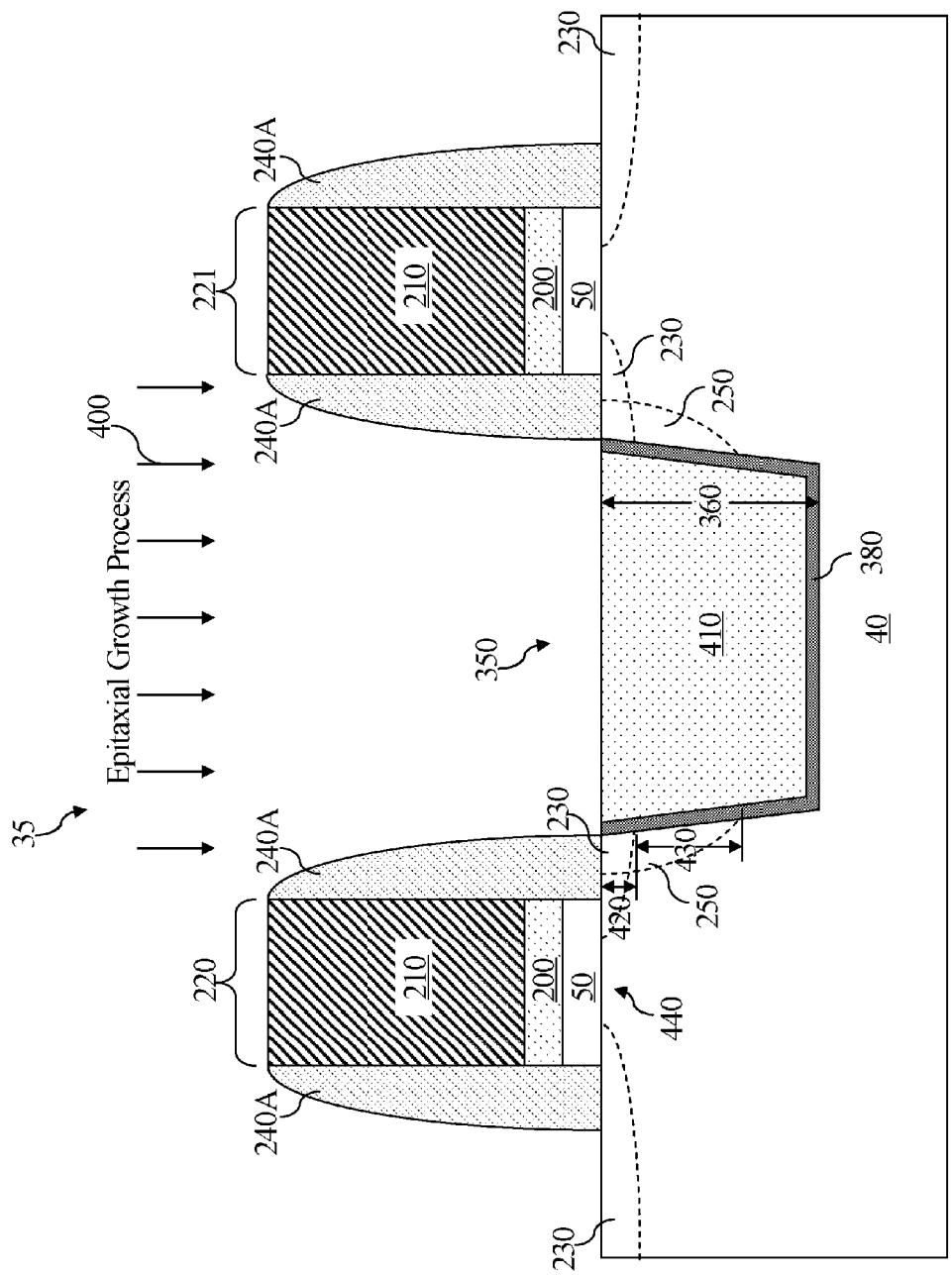

Referring to FIG. 8, an epitaxial growth process 400 (also referred to as an SiP growth process) is performed to epitaxially grow a doped region 410 in the recess 350. The doped region 410 contains phosphorous as a dopant and substantially fills the recess 350. The epitaxial growth process 400 allows the doped region 410 to have a high doping concentration level—higher than the doping concentration levels of the LDD region 230 and the doped region 250. In an embodiment, the doping concentration level of the doped region 410 is in a range from about $5 \times 10^{20}$ atoms/centimeter$^3$ to about $1 \times 10^{21}$ atoms/centimeter$^3$. Hence, the doped region 410 has a higher doping concentration level than the doped region 250, which has a higher doping concentration level than the LDD region 230.

The doped region 410 borders the remaining portions of the LDD region 230 and the doped region 250. The doped region also extends deeper into the substrate 40 than the LDD region 230 and the doped region 250. In an embodiment, the doped region has the depth 360 (also shown in FIG. 7 as the depth of the recess 350) that is in a range from about 200 Angstroms to about 300 Angstroms, whereas the LDD region 230 has a depth 420 that is in a range from about 100 Angstroms to about 200 Angstroms, and the doped region 250 has a depth 430 that is in a range from about 150 Angstroms to about 250 Angstroms.

The doped region 410 and the doped region 250 collectively serve as the source/drain (S/D) region of the semiconductor device 35, with the doped region 410 constituting the main portion of the S/D region. It is desirable for the S/D region to have good conductivity, and therefore it is desirable for the doped region 410 to have a high doping concentration level. According to some traditional fabrication methods, the S/D region is formed by an implantation process only, which may not be able to achieve the desired high doping concentration level. According to some other traditional fabrication methods, an epi-growth is used to form a highly doped S/D region. However, those traditional methods often suffer from problems such as current crowding and/or phosphorous out-diffusion. For example, current crowding may be due to a narrow conduction path from the channel (underneath the gate) to the S/D region, and phosphorous out-diffusion may be caused by high temperature processes performed later, such as annealing processes.

In comparison, the embodiments disclosed herein offer advantages over traditional fabrication methods, it being understood that different embodiments may offer different advantages, and that no particular advantage is required for all embodiments. One of the advantages is substantial reduction of the current crowding issue. As can be seen in FIG. 8 (not drawn in scale), the conduction path from a channel region 440 to the doped region 410 goes through the LDD region 230 and the doped region 250. This conduction path has a gradual increase in depth, in that the doped region 250 is deeper than the LDD region 230, and the doped region 410 is deeper than the doped region 250. This gradual increase in depth means that the current is less likely to be "crowded" or "pinned" within the relatively narrow LDD region 230. Stated differently, the conduction path has a gradient shape or geometry.

Further, the increase in doping concentration from the LDD region 230 to the doped region 250 is gradual (from a range of 5E19-2E20 atoms/centimeter$^3$ to a range of 2E20-4E20 atoms/centimeter$^3$). The increase in doping concentration from the doped region 250 to the doped region 410 is also gradual (from a range of 2E20-4E20 atoms/centimeter$^3$ to a range of 5E20-1E21 atoms/centimeter$^3$). As such, the resulting doping profile of the conduction path does not have a undesirable step-function-like shape. This means that the electric field along the conduction path is relatively smooth and is free of intense spots contrasted with weak spots. Stated differently, the conduction path has a gradient doping concentration profile as well. The relatively smooth electric field and the gradual expansion of the conduction path may boost the channel saturation current and may reduce leakage current (such as bulk junction leakage current or gate-induced drain leakage current). The relatively smooth electric field and the reduction of current crowding may also help achieve low S/D resistance.

Another advantage of the embodiments disclosed herein is good control of phosphorous out-diffusion. Sufficient control of out-diffusion is important because as device sizes shrink, dopant out-diffusion may begin to degrade device performance and may even cause the device to malfunction. For example, the small dimensions of modern-day transistor devices may mean that an N-type dopant can easily be diffused into what is supposed to be a P-type region (or vice versa) or an undoped region, since the dopant only needs to travel a short distance (because of shrinking device dimensions) to get there. As discussed above, the low temperature (between −60 C and −100 C) ion implantation process 245 used to form the doped region 250 means that very little dopant out-diffusion will occur during the formation of the doped region 250. Furthermore, the layer 380 optionally formed on the surface of the recess 350 in effect surrounds the doped region 410 and provides a buffer for any potential phosphorous out-diffusion from the doped region 410 caused by future fabrication processes. For example, the diffused phosphorous dopant ions may be absorbed by the layer 410 and thus may not reach a region that should be free of phosphorous dopant ions.

Figure 9:
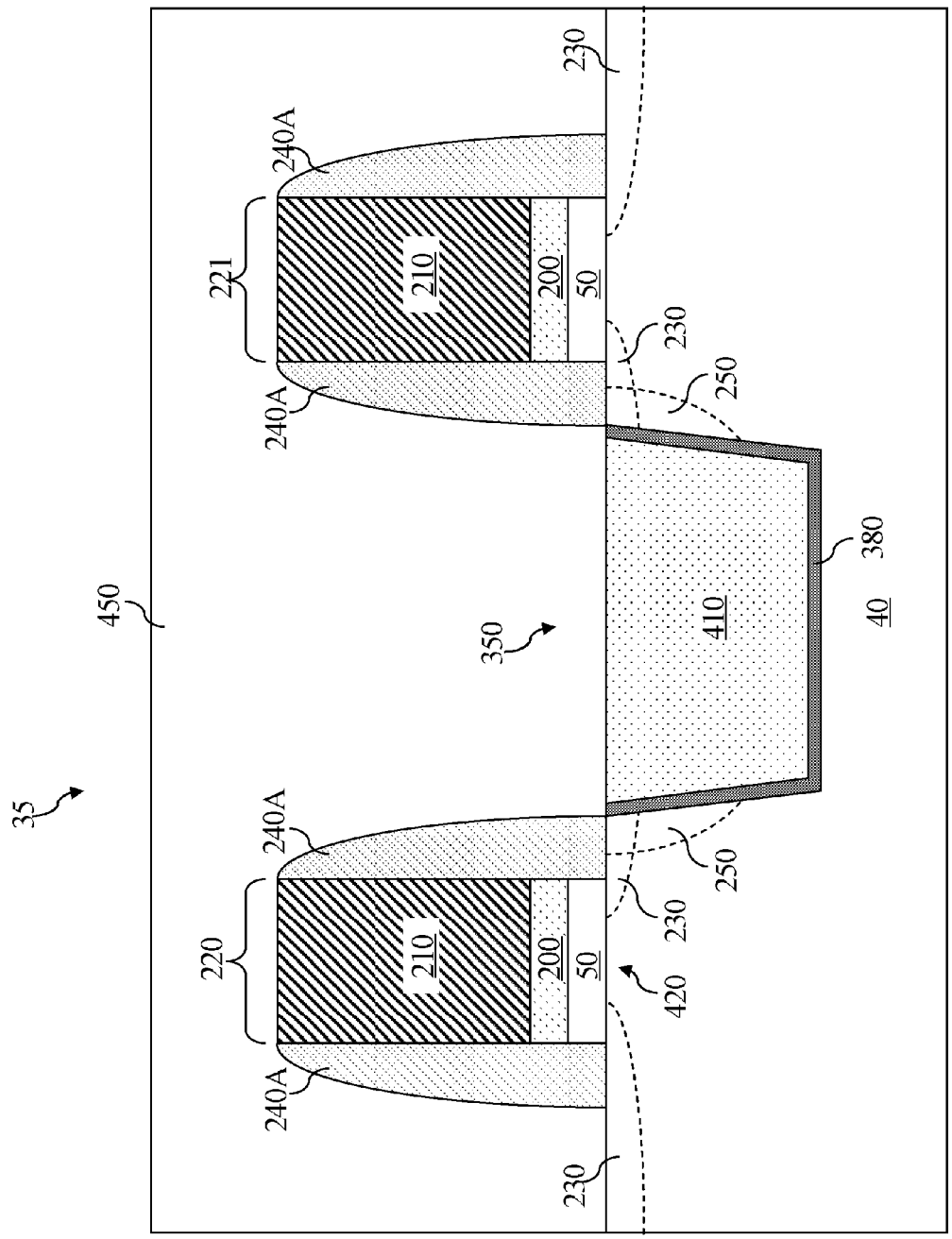

Additional fabrication processes may be performed to complete the fabrication of the semiconductor device 35. Referring to FIG. 9, an inter-layer (or inter-level) dielectric (ILD) layer 450 is formed over the substrate 40 and the gate structures 220-221. The ILD layer 450 may be formed by chemical vapor deposition (CVD), high density plasma CVD, spin-on, sputtering, or other suitable methods. In an embodiment, the ILD layer 450 includes silicon oxide. In other embodiments, the ILD layer 450 may include silicon oxynitride, silicon nitride, or a low-k material.

Figure 10:
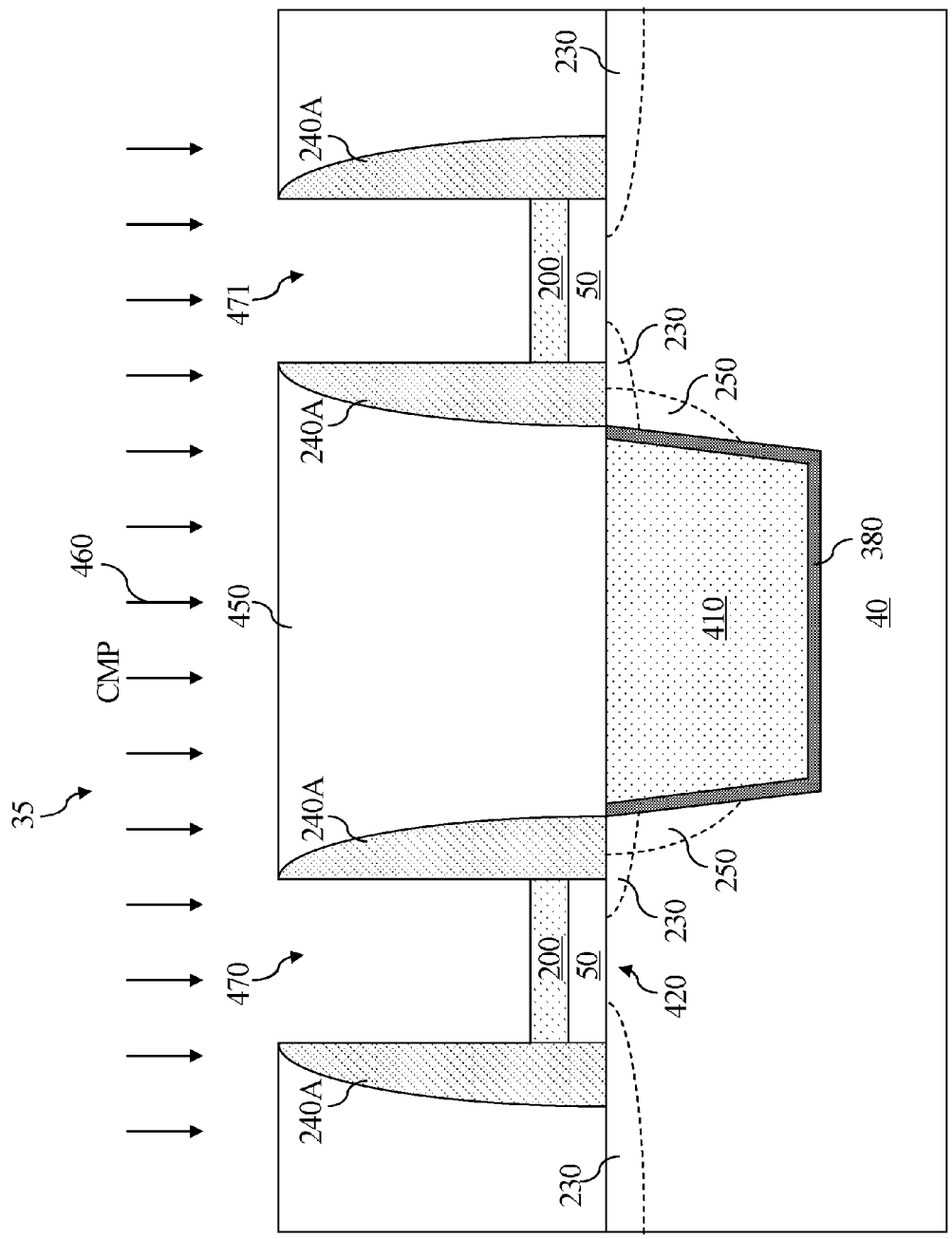

Referring to FIG. 10, a chemical-mechanical-polishing (CMP) process 460 is performed on the ILD layer 450 to expose top surfaces of the gate structures 220-221. Following the CMP process 460, the top surfaces of the gate structures 220-221 are substantially co-planar with the top surface of the ILD layer 450 on either side of the gate structures 220-221.

The gate electrode layer 490 is then removed, thereby forming trenches (or openings) 470-471 in place of the gate electrode layer 490. The gate electrode layer 490 may be removed in a wet etching or a dry etching process known in the art, while the rest of the layers of the semiconductor device 35 remain substantially unetched, including the gate dielectric layer 200, the gate spacers 240A, and the ILD layer 450. Since the gate electrode layer 490 is removed, it is also referred to as a dummy gate electrode layer.

Figure 11:
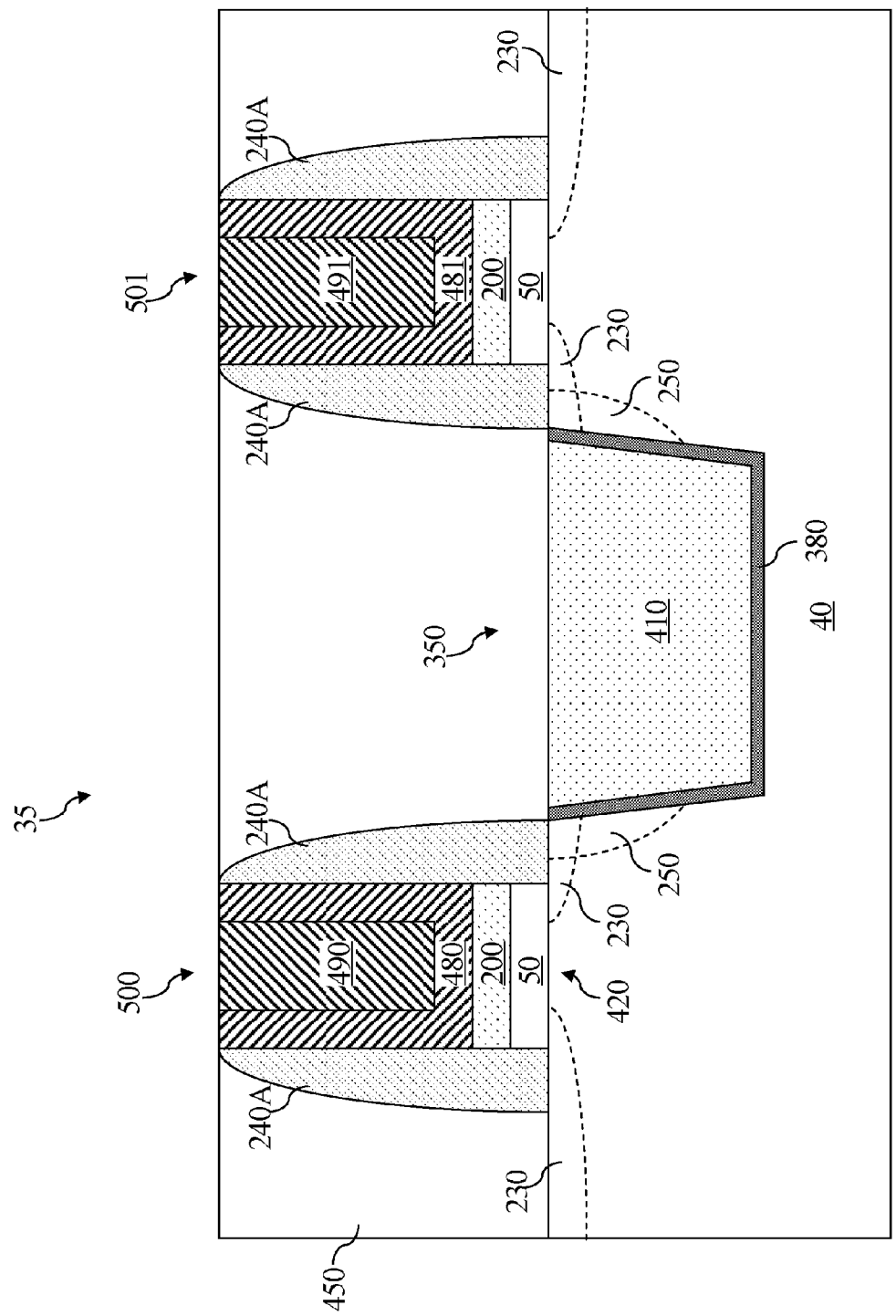

Referring now to FIG. 11, metal portions 480-481 are formed within the trenches 470-471, respectively, and over the gate dielectric layer 200. The metal portions 480-481 include one of TiN, TaN, TaC, TaSiN, WN, TiAl, TiAlN, or combinations thereof. The metal portions 480-481 may be formed by CVD, physical vapor deposition (PVD), or another suitable technique. The metal portions 480-481 can tune a work function of their respective transistor so that a desired threshold $V_t$ voltage is achieved for the transistor. Thus, the metal portions 480-481 may also be referred to as work function metal.

Thereafter, metal portions 490 and 491 are formed within the trenches 470 and 471 and over the metal portions 200 and 201, respectively. The metal portions 490 and 491 each include one of tungsten (W), Aluminum (Al), copper (Cu), or combinations thereof. The metal portions 490 and 491 may be formed by CVD, PVD, plating, or another suitable technique.

Gate structures 500-501 are formed by the metal portions 480-481 and 490-491, respectively, and their respective high-k gate dielectric layer 200 therebelow. The metal portions 480-481 and 490-491 together constitute the gate electrode portions of the gate structures 220-221. The metal portions 490-491 serve as the main conductive portions of the gate electrodes and may be referred to as fill metal.

FIGS. 2-11 illustrate a "gate-last" process. In the gate last process, dummy gate electrodes (for example dummy polysilicon gate electrodes) are formed initially. These dummy gate electrodes are later replaced with metal gate electrodes. Alternatively, a "high-k last" process may be performed instead. According to the "high-k last" approach, the gate dielectric layer 200 would be formed using a silicon oxide material, thereby constituting dummy gate dielectric layers. The dummy gate dielectric layers would also be removed along with the dummy gate electrodes later. High-k dielectric layers would then be formed to replace the dummy gate dielectric layers, and the metal electrodes would also be formed to replace the dummy gate electrodes. For the sake of simplicity, the "high-k last" approach is not illustrated herein. It is also understood that the benefits offered by the embodiments described herein applies to both the "gate-last" and the "high-k last" processes. Namely, the low temperature implantation process 245 (FIG. 4) and the epitaxial growth process 400 collectively result in a highly-activated S/D region that has an improved gradient doping profile, such that the current crowding effect and dopant out-diffusion issues are substantially mitigated.

It is understood that additional processes may be performed to complete the fabrication of the semiconductor device 35. For example, these additional processes may include formation of interconnect structures, deposition of passivation layers, formation of contacts, packaging, and testing. For the sake of simplicity, these additional processes are not described herein.

One of the broader forms of the present disclosure involves a method of fabricating a semiconductor device. The method includes: forming a gate over a substrate; performing a first implantation process to form a first doped region in the substrate, the first doped region being adjacent to the gate; performing a second implantation process to form a second doped region in the substrate, the second doped region being formed farther away from the gate than the first doped region, the second doped region having a higher doping concentration level than the first doped region; removing portions of the first and second doped regions to form a recess in the substrate; and epitaxially growing a third doped region in the recess, the third doped region having a higher doping concentration level than the second doped region.

Another one of the broader forms of the present disclosure involves a method of fabricating a semiconductor device. The method includes: forming a gate over a substrate; forming a lightly-doped source/drain (LDD) region in the substrate in a manner such that a boundary of the LDD region is at least partially defined by a sidewall of the gate; forming a spacer on the sidewall of the gate, the spacer at least partially overlying the LDD region; forming a heavily-doped region in the substrate in a manner such that a boundary of the heavily doped region is at least partially defined by the spacer, and wherein the heavily doped region is more heavily doped than the LDD region and has a greater depth than the LDD region; trimming the spacer in a manner such that the trimmed spacer has a reduced lateral dimension; forming an opening in a portion of the substrate containing the LDD region and the heavily-doped region, wherein the opening is at least partially aligned with the trimmed spacer; and performing an epitaxial growth process to at least partially fill the opening with a doped component, wherein the doped component is more heavily doped than the heavily-doped region.

Another one of the broader forms of the present disclosure involves a semiconductor device. The semiconductor device includes: a gate structure disposed over a substrate; a gate spacer disposed on a sidewall of the gate structure; a first doped region disposed in the substrate and at least partially overlapping with the gate structure, the first doped region having a first doping concentration level and a first depth; a second doped region disposed in the substrate and at least partially overlapping with the gate spacer but not with the gate structure, the second doped region having a second doping concentration level greater than the first doping concentration level and a second depth greater than the first depth; and a third doped region disposed in the substrate and at least partially aligned with an outer boundary of the gate spacer, the third doped region having a third doping concentration level greater than the second doping concentration level and a third depth greater than the second depth.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a gate disposed over a substrate, the gate including a gate electrode;
   a spacer disposed on a sidewall of the gate, wherein the sidewall of the gate is partially defined by the gate electrode;

a first doped region disposed in the substrate, wherein a portion of the first doped region is disposed beneath the gate;
a second doped region disposed in the substrate, wherein a portion of the second doped region is disposed beneath the spacer but not the gate, the second doped region being more heavily doped than the first doped region; and
a third doped region disposed in the substrate, wherein the third doped region is aligned with the spacer and is not disposed below the gate, the third doped region being more heavily doped than the second doped region;
wherein:
the second doped region extends further into the substrate than the first doped region; and
the third doped region extends further into the substrate than the second doped region.

2. The semiconductor device of claim 1, wherein a different portion of the first doped region is disposed beneath the spacer.

3. The semiconductor device of claim 1, wherein the first doped region overlaps with the second doped region.

4. The semiconductor device of claim 1, wherein a side of the third doped region borders the first doped region and the second doped region.

5. The semiconductor device of claim 1, wherein the third doped region is at least partially surrounded by an silicon layer that is substantially free of phosphorous.

6. The semiconductor device of claim 1, wherein:
the first doped region has a doping concentration level in a range from about $1\times10^{20}$ atoms/centimeter$^3$ to about $2\times10^{20}$ atoms/centimeter$^3$;
the second doped region has a doping concentration level in a range from about $2\times10^{20}$ atoms/centimeter$^3$ to about $4\times10^{20}$ atoms/centimeter$^3$; and
the third doped region has a doping concentration level is in a range from about $5\times10^{20}$ atoms/centimeter$^3$ to about $1\times10^{21}$ atoms/centimeter$^3$.

7. The semiconductor device of claim 1, wherein a depth of the third doped region is in a range from about 200 angstroms to about 300 angstroms.

8. The semiconductor device of claim 1, the gate includes a high-k gate dielectric and a metal gate electrode.

9. The semiconductor device of claim 1, wherein the first doped region, the second doped region, and the third doped region collectively constitute a source/drain region of the semiconductor device.

10. A semiconductor device, comprising:
a gate stack disposed over a substrate, the gate stack including a high-k gate electric and a metal gate electrode disposed over the high-k gate dielectric, wherein the gate stack is free of a gate spacer;
a spacer disposed on a sidewall of the gate stack; and
a source/drain region disposed in the substrate, wherein the source/drain region includes:
a first doped region disposed below the spacer and partially below the gate stack;
a second doped region that partially overlaps with the first doped region, the second doped region being more heavily doped than the first doped region and extends further into the substrate than the first doped region; and
a third doped region bordering both the first doped region and the second doped region, wherein the third doped region is more heavily doped than the second doped region and extends further into the substrate than the second doped region.

11. The semiconductor device of claim 10, wherein the third doped region is vertically aligned with the spacer.

12. The semiconductor device of claim 10, wherein:
the first doped region has a doping concentration level in a range from about $1\times10^{20}$ atoms/centimeter$^3$ to about $2\times10^{20}$ atoms/centimeter$^3$;
the second doped region has a doping concentration level in a range from about $2\times10^{20}$ atoms/centimeter$^3$ to about $4\times10^{20}$ atoms/centimeter$^3$; and
the third doped region has a doping concentration level is in a range from about $5\times10^{20}$ atoms/centimeter$^3$ to about $1\times10^{21}$ atoms/centimeter$^3$.

13. The semiconductor device of claim 10, wherein the third doped region is at least partially surrounded by a silicon layer free of phosphorous.

14. The semiconductor device of claim 10, wherein a depth of the third doped region is in a range from about 200 angstroms to about 300 angstroms.

15. A semiconductor device, comprising:
a gate structure disposed over a doped substrate;
a gate spacer disposed on a sidewall of the gate structure;
a first doped region disposed in the substrate and at least partially overlapping with the gate structure, the first doped region having a first doping concentration level and a first depth;
a second doped region disposed in the substrate and at least partially overlapping with the gate spacer but not with the gate structure, the second doped region having a second doping concentration level greater than the first doping concentration level and a second depth greater than the first depth; and
a third doped region disposed in the substrate and at least partially aligned with an outer boundary of the gate spacer, the third doped region having a third doping concentration level greater than the second doping concentration level and a third depth greater than the second depth, wherein the third doped region is surrounded by a silicon layer that is undoped.

16. The semiconductor device of claim 15, wherein:
the first doping concentration level is in a range from about $5\times10^{19}$ atoms/centimeter$^3$ to about $2\times10^{20}$ atoms/centimeter$^3$;
the second doping concentration level is in a range from about $2\times10^{20}$ atoms/centimeter$^3$ to about $4\times10^{20}$ atoms/centimeter$^3$; and
the third doping concentration level is in a range from about $5\times10^{20}$ atoms/centimeter$^3$ to about $1\times10^{21}$ atoms/centimeter$^3$.

17. The semiconductor device of claim 15, wherein:
the first doped region and the second doped region partially overlap with one another; and
the first doped region and the second doped region each border with the third doped region.

18. The semiconductor device of claim 15, wherein the silicon layer is free of phosphorous.

19. The semiconductor device of claim 15, the gate structure includes a high-k gate dielectric and a metal gate electrode.

* * * * *